(12) United States Patent
Xu et al.

(10) Patent No.: US 10,544,255 B2
(45) Date of Patent: Jan. 28, 2020

(54) EPOXY RESIN COMPOSITION, PREPREG AND LAMINATE PREPARED THEREFROM

(71) Applicant: SHENGYI TECHNOLOGY CO., LTD., Dongguan, Guangdong (CN)

(72) Inventors: Haosheng Xu, Dongguan (CN); Xianping Zeng, Dongguan (CN); Liexiang He, Dongguan (CN)

(73) Assignee: SHENGYI TECHNOLOGY CO., LTD., Dongguan (CN)

( * ) Notice: Subject to any disclaimer, the term of this patent is extended or adjusted under 35 U.S.C. 154(b) by 353 days.

(21) Appl. No.: 15/305,759

(22) PCT Filed: Mar. 29, 2016

(86) PCT No.: PCT/CN2016/077730
§ 371 (c)(1),
(2) Date: Oct. 21, 2016

(87) PCT Pub. No.: WO2017/113522
PCT Pub. Date: Jul. 6, 2017

(65) Prior Publication Data
US 2018/0016387 A1    Jan. 18, 2018

(30) Foreign Application Priority Data

Dec. 28, 2015  (CN) .......................... 2015 1 1019388

(51) Int. Cl.
| | | |
|---|---|---|
| *C08G 59/26* | (2006.01) | |
| *C08L 63/00* | (2006.01) | |
| *B32B 38/08* | (2006.01) | |
| *B32B 37/10* | (2006.01) | |
| *B32B 17/04* | (2006.01) | |
| *C08L 79/04* | (2006.01) | |
| *C08G 59/42* | (2006.01) | |
| *C08G 59/68* | (2006.01) | |
| *C08J 5/24* | (2006.01) | |
| *C08K 3/36* | (2006.01) | |
| *C08K 5/00* | (2006.01) | |
| *H05K 1/03* | (2006.01) | |
| *C08K 7/18* | (2006.01) | |

(52) U.S. Cl.
CPC .............. *C08G 59/26* (2013.01); *B32B 17/04* (2013.01); *B32B 37/10* (2013.01); *B32B 38/08* (2013.01); *C08G 59/4223* (2013.01); *C08G 59/686* (2013.01); *C08J 5/24* (2013.01); *C08K 3/36* (2013.01); *C08K 5/0066* (2013.01); *C08K 7/18* (2013.01); *C08L 63/00* (2013.01); *C08L 79/04* (2013.01); *H05K 1/0306* (2013.01); *H05K 1/0373* (2013.01); *C08J 2363/00* (2013.01); *C08J 2363/02* (2013.01); *C08J 2479/04* (2013.01); *C08K 2201/005* (2013.01); *C08L 2201/02* (2013.01); *C08L 2203/20* (2013.01)

(58) Field of Classification Search
CPC .. C08G 59/26; C08G 59/4223; C08G 59/686; B32B 17/04; B32B 37/10; B32B 38/08; C08J 5/24; C08J 2363/02; C08J 2363/00; C08J 2479/04; C08K 3/36; C08K 5/0066; C08K 7/18; C08K 2201/005; C08L 63/00; C08L 79/04; C08L 2201/02; C08L 2203/20; H05K 1/0306; H05K 1/0373
USPC ....................................................... 523/400
See application file for complete search history.

(56) References Cited

U.S. PATENT DOCUMENTS

| | | | |
|---|---|---|---|
| 4,229,351 A | 10/1980 | Kiefer et al. | |
| 4,927,736 A | 5/1990 | Mueller et al. | |
| 9,873,789 B2 | 1/2018 | Zeng et al. | |
| 2010/0227090 A1 | 9/2010 | Liao et al. | |
| 2011/0235292 A1 | 9/2011 | Jung et al. | |
| 2012/0043508 A1 | 2/2012 | Hirai et al. | |
| 2012/0136094 A1 | 5/2012 | Chen et al. | |
| 2013/0161080 A1 | 6/2013 | Lin | |
| 2014/0228483 A1* | 8/2014 | Shirrell | C08G 59/621 523/400 |
| 2014/0342161 A1 | 11/2014 | Zeng | |
| 2015/0291726 A1* | 10/2015 | Mueller | C08G 59/4028 528/56 |
| 2015/0344617 A1* | 12/2015 | Arita | C08G 59/62 428/209 |

(Continued)

FOREIGN PATENT DOCUMENTS

| | | |
|---|---|---|
| CN | 1680375 A | 10/2005 |
| CN | 1989203 A | 6/2007 |
| CN | 101244645 A | 8/2008 |

(Continued)

OTHER PUBLICATIONS

Takeuchi et al., JP 2009-235165 A machine translation in English, Oct. 15, 2009 (Year: 2009).*

(Continued)

*Primary Examiner* — David T Karst
(74) *Attorney, Agent, or Firm* — McCarter & English, LLP; Steven G. Davis; Wei Song

(57) ABSTRACT

The present invention relates to an epoxy resin composition, comprising the following components: (A) an epoxy resin containing oxazolidinone structure having the structure of the formula (1), (B) an active ester curing agent, and (C) a curing accelerator. The epoxy composition, prepreg, laminate and printed circuit board prepared from such epoxy composition have the following features of low coefficient of thermal expansion, low dielectric loss factor Df less than or equal to 0.0084, low water absorption and excellent moisture and heat resistance.

18 Claims, No Drawings

(56) References Cited

U.S. PATENT DOCUMENTS

| | | |
|---|---|---|
| 2017/0002131 A1 | 1/2017 | Zeng et al. |
| 2017/0009074 A1 | 1/2017 | Xi et al. |

FOREIGN PATENT DOCUMENTS

| | | | | |
|---|---|---|---|---|
| CN | 101831051 A | | 9/2010 | |
| CN | 102051022 A | | 5/2011 | |
| CN | 102134375 A | | 7/2011 | |
| CN | 102206397 A | | 10/2011 | |
| CN | 102399415 A | | 4/2012 | |
| CN | 102516541 A | | 6/2012 | |
| CN | 102558858 A | | 7/2012 | |
| CN | 102732029 A | | 10/2012 | |
| CN | 102850545 A | | 1/2013 | |
| CN | 102858839 A | | 1/2013 | |
| CN | 102977551 A | | 3/2013 | |
| CN | 103265791 A | | 8/2013 | |
| CN | 103382242 A | | 11/2013 | |
| CN | 103421273 A | | 12/2013 | |
| CN | 103540220 A | * | 1/2014 | ............... C09D 7/12 |
| CN | 103834168 A | | 6/2014 | |
| CN | 103992621 A | | 8/2014 | |
| CN | 104592467 A | | 5/2015 | |
| CN | 105295041 A | | 2/2016 | |
| CN | 105440263 A | | 3/2016 | |
| CN | 105482076 A | | 4/2016 | |
| EP | 0113575 A1 | | 7/1984 | |
| EP | 2770024 A1 | | 8/2014 | |
| EP | 2896654 A1 | | 7/2015 | |
| JP | S61167684 A | | 7/1986 | |
| JP | H01319528 A | | 12/1989 | |
| JP | H11052567 A | | 2/1999 | |
| JP | 2000186133 A | | 7/2000 | |
| JP | 2001348420 A | | 12/2001 | |
| JP | 2003231753 A | | 8/2003 | |
| JP | 2003-252958 A | | 9/2003 | |
| JP | 2009235165 A | * | 10/2009 | ............. C08G 59/62 |
| JP | 2010053070 A | | 3/2010 | |
| JP | 2010053071 A | | 3/2010 | |
| JP | 2010-100802 A | | 5/2010 | |
| JP | 2011173827 A | | 9/2011 | |
| JP | 2014-132074 A | | 7/2014 | |
| KR | 10-2011-0048049 A | | 5/2011 | |
| KR | 10-2012-0079986 A | | 7/2012 | |
| KR | 10-2013-0125384 A | | 11/2013 | |
| WO | 2000037442 A1 | | 6/2000 | |
| WO | 2011/059633 A2 | | 5/2011 | |
| WO | 2012124780 A1 | | 9/2012 | |
| WO | WO-2014061450 A1 | * | 4/2014 | ............. C08G 59/62 |
| WO | 2014/076024 A1 | | 5/2014 | |
| WO | 2015127860 A1 | | 9/2015 | |
| WO | 2015/179232 A1 | | 11/2015 | |
| WO | 2016101538 A1 | | 6/2016 | |
| WO | 2016101540 A1 | | 6/2016 | |

OTHER PUBLICATIONS

Chen et al., CN 103540220 A machine translation in English, Jan. 29, 2014 (Year: 2014).*

Supplementary European Search Report for Application No. 15864296.7, dated Jul. 27, 2017. 6 pages.

Liu, Jia "Synthesis and Properties of Novel Heat Resistant, Halogen-Free Flame Retardant Epoxy Resin," Science-Engineering (A), China Master Thesis Full Text Database, vol. / No. 06 Jun. 15, 2013, pp. B016-B161.

Australian Office Action for Application No. 2016247084, dated Apr. 19, 2017. 9 pages.

International Search Report for Application No. PCT/CN2016/077730, dated Jun. 30, 2016. 4 pages.

Supplementary European Search Report for Application No. 16785078.3, dated Dec. 7, 2017. 6 pages.

* cited by examiner

EPOXY RESIN COMPOSITION, PREPREG AND LAMINATE PREPARED THEREFROM

CROSS-REFERENCE TO RELATED APPLICATIONS

This application is a U.S. national stage filing, under 35 U.S.C. § 371(c), of International Application No. PCT/CN2016/077730, filed on Mar. 29, 2016, which claims priority to Chinese Patent Application No. 201511019388.0, filed on Dec. 28, 2015. The entire contents of each of the aforementioned applications are incorporated herein by reference.

TECHNICAL FIELD

The present invention belongs to the technical field of the copper-clad laminate, specifically relates to an epoxy resin composition, prepreg, laminate and printed circuit board prepared therefrom.

BACKGROUND

Along with the development of information communication equipments in the direction of high performance, high functionalization and networking, the operation signals tend to high frequency in recent years for high-speed transmission and processing of large-capacity information. Meanwhile, circuit boards are developed in the direction of high multilayer and high wiring density in order to meet the requirements on the development trends of various electronic products, which requires that the substrate materials have not only a relatively low and stable dielectric constant and dielectric loss factor to meet the requirements on high frequency transmission of signals, but also better heat resistance to meet the requirements on reliability of multilayer printed circuit boards.

CN101815734A disclosed a process for synthesizing isocyanate-modified epoxy by reacting multifunctional epoxy resin with diisocyanate compound, wherein such resin had a high softening point required by powder coatings. CN102666633A disclosed an epoxy oxazolidinone resin composition comprising divinylarene dioxide and reaction products of excessive polyisocyanate, and a curable epoxy resin composition, comprising the epoxy oxazolidinone resin composition of divinylarene dioxide derived from divinylbenzene dioxide, and polyisocyanate, at least a curing agent, and/or a catalyst. The composition had the features of low viscosity and high heat resistance.

CN1333791A disclosed a binder composition prepared from polyepoxide, polycyanate and chain extender, wherein such composition was advantageous to enhance the adhesiveness between copper foil and laminate.

CN101695880A disclosed a process for preparing polyoxazolidinone laminates, comprising reacting diisocynate with epoxy in the presence of imidazole catalyst to produce polyoxazolidinone, then preparing laminates by using the resultant polyoxazolidinone, wherein the prepared laminates had better mechanical strength and heat resistance.

JP2003-252958 disclosed obtaining cured products having a reduced dielectric loss factor by using biphenyl epoxy resin and active ester curing agent. Since the epoxy resin used therein was bifunctional, it had a low crosslinking density with active ester curing agent, and the condensate thereof had a low glass transition temperature.

Although the aforesaid patents disclosed that isocyanate-modified epoxy or polyoxazolidinone itself and the composition thereof had better adhesiveness, heat resistance and tenacity, but they had the defects such as worse moisture and heat resistance, lower reliability, and relatively higher dielectric loss factor, so as to limit the application in high-speed materials.

DISCLOSURE OF THE INVENTION

As for the problems in the prior art, the object of the present invention lies in providing an epoxy resin composition, as well as a prepreg and laminate prepared therefrom. The laminate prepared from such resin composition has a low dielectric loss factor, a low water absorption, excellent moisture and heat resistance and meets the performance requirements for printed circuit boards in the high-frequency high-speed era.

The inventor of the present invention found, by research, that the composition obtained by appropriately mixing an epoxy resin containing oxazolidinone structure, an active ester curing agent, and a curing accelerator, and other optional components can achieve the aforesaid object.

An epoxy resin composition comprises the following components:

(A) an epoxy resin containing oxazolidinone structure having the structure of the formula (1)

Formula (1)

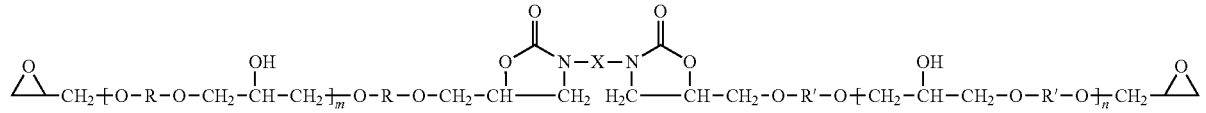

wherein m and n are each independently selected from the group consisting of 0, 1 and 2;

X is anyone independently selected from the group consisting of

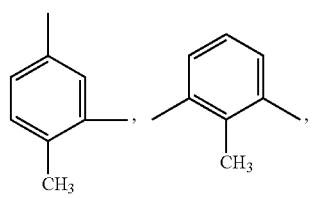

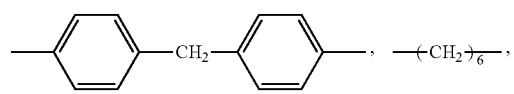

-continued

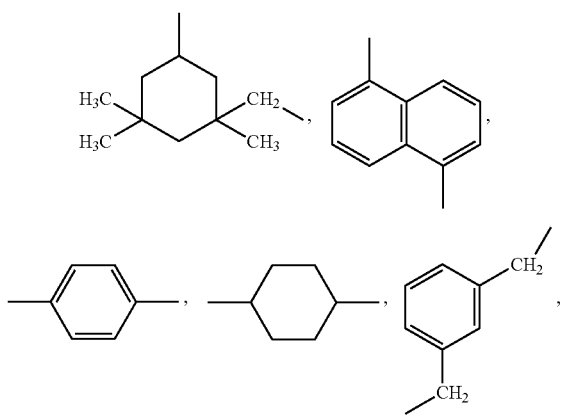

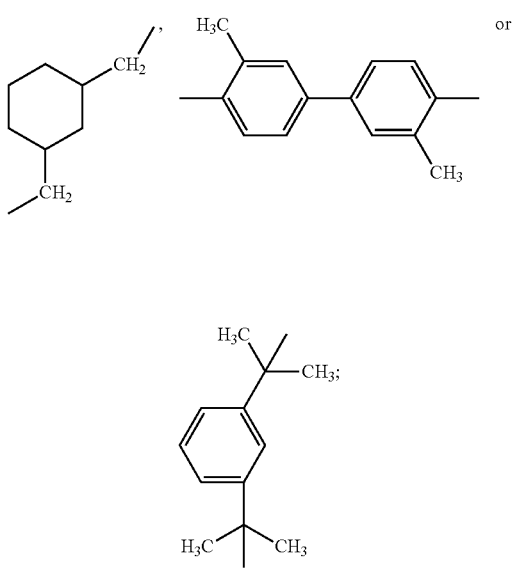

R and R' each is independently selected from any organic group;

(B) an active ester curing agent; and (C) a curing accelerator

The epoxy resin containing oxazolidinone structure in the present invention comprises 5-membered heterocyclic oxazolidinone structure of C, N and O in the main chain. The molecular chain thereof has a great rigidity, a low coefficient of thermal expansion, but a high water absorption. While reducing the formation of secondary hydroxyl group and the water absorption thereof, the introduction of active ester will ensure the composition play its feature of lower dielectric loss factor of the oxazolidinone structure during the curing process. By the synergistic effect of the epoxy resin containing oxazolidinone structure and active ester, the epoxy resin composition provided by the present invention ensures the epoxy resin composition have a lower water absorption and a lower dielectric loss factor compared to the composition containing isocyanate or active ester alone, which ensure that the composition has a higher reliability.

By using the interaction and mutual synergistic effects of the aforesaid three necessary components, the present invention obtains the aforesaid epoxy resin composition. The prepreg and laminate prepared by using such epoxy resin composition have a low coefficient of thermal expansion of thermal expansion, a low dielectric loss factor, a low water absorption and excellent moisture and heat resistance.

Preferably, m=0, and n=0 in the structure of formula (1); the component (A) epoxy resin containing oxazolidinone structure has the structure of formula (2)

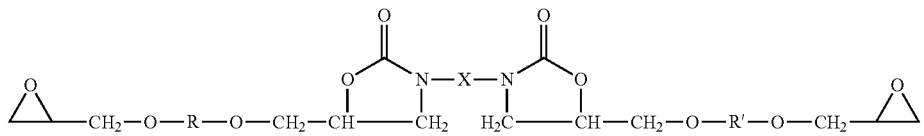

Formula (2)

In the formula (2), R and R' have the same scope as those in claim 1.

Preferably, R and R' in the formulae (1) and (2) each are anyone independently selected from the group consisting of the following structures:

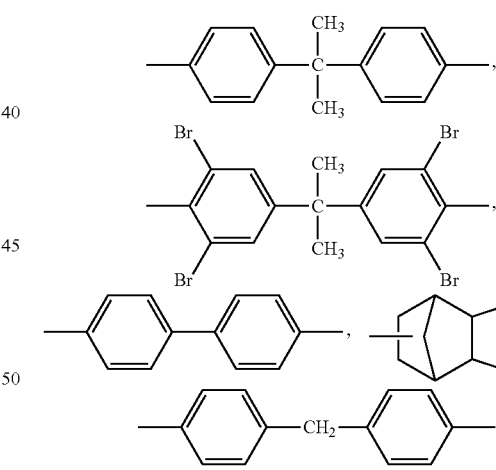

Preferably, R and R' are the same.

Preferably, the component (A) epoxy resin containing oxazolidinone structure is an epoxy resin containing oxazolidinone structure and having bisphenol-A and/or tetrabromobisphenol-A structure.

Preferably, the component (A) epoxy resin containing oxazolidinone structure and the component (B) active ester curing agent have an epoxide equivalent/ester group equivalent ratio of 1:0.9-1.1, e.g. 1:0.92, 1:0.94, 1:0.96, 1:0.98, 1:1, 1:1.02, 1:1.04, 1:1.06 or 1:1.08.

Preferably, the component (B) active ester curing agent is obtained by reacting a phenolic compound linked via aliphatic cyclic hydrocarbon structure, a difunctional carboxylic aromatic compound or an acidic halide with a monohydroxy compound. Said difunctional carboxylic aromatic compound or acidic halide is in an amount of 1 mol; the phenolic compound linked via aliphatic cyclic hydrocarbon structure is in an amount of 0.05-0.75 mol; the monohydroxy compound is in an amount of 0.25-0.95 mol.

Preferably, the component (B) active ester curing agent comprises an active ester having the structure of formula (3):

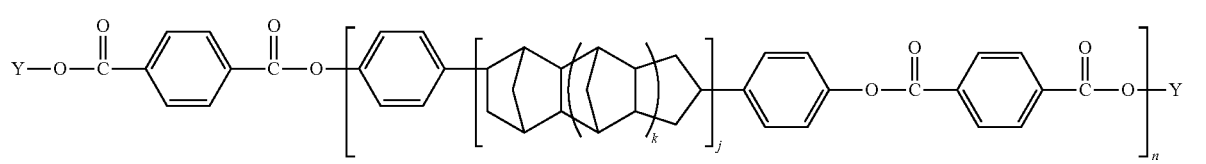

Formula (3)

wherein Y is phenyl or naphthyl; j is 0 or 1; k is 0 or 1; n represents that the repeating unit is 0.25-1.25.

Due to the special structure of the active ester curing agent, the rigid structures therein, such as phenyl, naphthyl, cyclopentadiene and the like, endow a high thermal resistance to the active ester. Meanwhile, the structural regularity thereof and no production of secondary hydroxyl group during the reaction with the epoxy resin endow with better electrical property and lower water absorption.

Preferably, the component (C) curing accelerator of the present invention is selected from the group consisting of 4-dimethylaminopyridine, 2-methylimidazole, 2-ethyl-4-methyl-imidazole or 2-phenylimidazole, or a mixture of at least two selected therefrom.

The exemplary mixtures of the component (C) curing accelerator of the present invention may be a mixture of 4-dimethylaminopyridine and 2-methylimidazole, a mixture of 2-methylimidazole and 2-ethyl-4-methylimidazole or 2-phenylimidazole, or a mixture of 4-dimethylaminopyridine, 2-methylimidazole and 2-phenylimidazole.

Preferably, based on the sum of the addition amounts of the components (A) epoxy resin containing oxazolidinone structure and (B) active ester curing agent being 100 parts by weight, the component (C) curing accelerator is added in an amount of from 0.05 to 1 part by weight, e.g. 0.08 parts by weight, 0.1 parts by weight, 0.15 parts by weight, 0.2 parts by weight, 0.25 parts by weight, 0.3 parts by weight, 0.35 parts by weight, 0.4 parts by weight, 0.45 parts by weight, 0.5 parts by weight, 0.55 parts by weight, 0.60 parts by weight, 0.65 parts by weight, 0.7 parts by weight, 0.75 parts by weight, 0.8 parts by weight, 0.85 parts by weight, 0.9 parts by weight, or 0.95 parts by weight, preferably from 0.5 to 0.8 parts by weight.

Preferably, the epoxy resin composition of the present invention further comprises a cyanate ester resin.

Cyanate ester resin can better increase the glass transition temperature and decrease the coefficient of thermal expansion of the composition.

Preferably, based on the sum of the addition amounts of the components (A) epoxy resin containing oxazolidinone structure, (B) active ester curing agent and (C) curing accelerator being 100 parts by weight, the cyanate ester resin is added in an amount of 50 parts by weight or less, e.g. 12 parts by weight, 15 parts by weight, 25 parts by weight, 30 parts by weight, 35 parts by weight, 38 parts by weight, 43 parts by weight, 48 parts by weight, preferably 40 parts by weight or less, further preferably from 20 to 30 parts by weight.

The epoxy resin composition further comprises a flame retardant.

Preferably, the flame retardant is a bromine-containing flame retardant or/and halogen-free flame retardant.

Preferably, the flame retardant is added in an amount of from 5 to 50 parts by weight, based on the sum of the addition amounts of the components (A) epoxy resin containing oxazolidinone structure, (B) active ester curing agent and (C) curing accelerator being 100 parts by weight, e.g. 5 parts by weight, 10 parts by weight, 15 parts by weight, 25 parts by weight, 30 parts by weight, 35 parts by weight, 40 parts by weight, or 45 parts by weight.

Preferably, the bromine-containing flame retardant is anyone selected from the group consisting of decabromodiphenyl ethane, brominated polystyrene, ethylene bis-tetrabromo phthalimide or bromine-containing epoxy resin, or a mixture of at least two selected therefrom.

Preferably, the halogen-free flame retardant is anyone selected from the group consisting of
tri(2,6-dimethylphenyl)phosphine,
10-(2,5-dihydroxylphenyl)-9,10-dihydro-9-oxa-10-phosphaphenanthrene-10-oxide,
2,6-di(2,6-dimethylphenyl)-phosphinophenyl;
10-phenyl-9,10-dihydro-9-oxa-10-phosphaphenanthrene-10-oxide, phenoxy-phosphazene compound, zinc borate, nitrogen and phosphorus-based intumescent, organic polymer flame retardant, and copolymers of phosphorus-containing phenolic resin or phosphorus-containing bismaleimide, polyphosphonate, phosphonate and carbonate, or a mixture of at least two selected therefrom.

Preferably, the epoxy resin composition further comprises a filler which is an organic filler or/and an inorganic filler, if necessary, for adjusting some physical properties of the composition, e.g. reducing coefficient of thermal expansion (CTE) and water absorption and increasing thermal conductivity.

Preferably, based on the sum of the addition amounts of the components (A) epoxy resin containing oxazolidinone structure, (B) active ester curing agent, and (C) curing accelerator being 100 parts by weight, the filler is added in an amount of 100 parts by weight or less, preferably 50 parts by weight or less, e.g. 0.5 parts by weight, 1 part by weight, 5 parts by weight, 10 parts by weight, 15 parts by weight, 20 parts by weight, 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 75 parts by weight, 80 parts by weight, 85 parts by weight, 90 or 95 parts by weight, further preferably from 20 to 40 parts by weight.

Preferably, the inorganic filler is anyone selected from the group consisting of molten silica, crystal silica, spherical silica, hollow silica, aluminum hydroxide, alumina, talc, aluminum nitride, boron nitride, silicon carbide, barium sulfate, barium titanate, strontium titanate, calcium carbonate, calcium silicate, mica or glass fiber powder, or a mixture of at least two selected therefrom. The mixture is selected from the group consisting of, e.g. a mixture of molten silica and crystal silica, a mixture of spherical silica and hollow silica, a mixture of aluminum hydroxide and alumina, a mixture of talc and aluminum nitride, a mixture of boron nitride and silicon carbide, a mixture of barium sulfate and barium titanate, a mixture of strontium titanate and calcium carbonate, a mixture of calcium silicate, mica and glass fiber powder, a mixture of molten silica, crystal silica and spherical silica, a mixture of hollow silica, aluminum hydroxide and alumina, a mixture of talc, aluminum nitride and boron nitride, a mixture of silicon carbide, barium sulfate and barium titanate, a mixture of strontium titanate, calcium carbonate, calcium silicate, mica and glass fiber powder.

Preferably, the organic filler is anyone selected from the group consisting of polytetrafluoroethylene powder, polyphenylene sulfide or polyether sulfone, or a mixture of at least two selected therefrom. The mixture is selected from the group consisting of, e.g. a mixture of polytetrafluoroethylene powder and polyphenylene sulfide, a mixture of polyether sulfone and polytetrafluoroethylene powder, a mixture of polyphenylene sulfide and polyether sulfone, a mixture of polytetrafluoroethylene powder, polyphenylene sulfide and polyether sulfone.

Preferably, the filler is silica; the medium value of the particle size of the filler is from 1 to 15 μm, preferably from 1 to 10 μm.

The wording "comprise(s)/comprising" in the present invention means that there may comprise other components besides said components, which endow different properties to the epoxy resin composition. Besides, the wording "comprise(s)/comprising" in the present invention may be replaced with "is/are" or "consist(s)/consisting of".

For example, the epoxy resin composition may further comprise various additives, e.g. antioxidant, thermal stabilizer, antistatic agent, ultraviolet light absorber, pigment, colorant, lubricant and the like. These various additives may be used alone, or in combination.

The conventional method for preparing the resin composition of the present invention comprises: taking a container, first putting in solid components, then adding liquid solvent, stirring till complete dissolution, adding liquid resin, filler, flame retardant, curing accelerator, continuing to homogeneously stirring, and finally adjusting with the solvent till the solid content of the liquid to be 60-80% to prepare a glue solution.

The second object of the present invention lies in providing a prepreg comprising a reinforcing material and the above epoxy resin composition attached thereon after impregnation and drying.

The exemplary reinforcing material is selected from nonwoven fabrics or/and other fabrics, e.g. natural fibers, organic synthetic fibers and inorganic fibers.

The glue solution is used to impregnate the reinforcing material, e.g. fabrics such as glass cloth, or organic fabrics, and the impregnated reinforcing material is heated and dried in an oven at a temperature of 155° C. for 5-10 min to obtain a prepreg.

The third object of the present invention lies in providing a laminate comprising at least one sheet of the aforesaid prepreg.

The fourth object of the present invention lies in providing a printed circuit board which can reduce the Df value and water absorption, wherein the printed circuit board comprises at least one sheet of the laminate above.

As compared to the prior art, the present invention has the following beneficial effects.

(1) The epoxy resin composition of the present invention comprises an epoxy resin having oxazolidinone structure into the main chain, of which 5-membered ring structure possesses a great rigidity. Great rigidity of the molecular chain makes the cured product have a low coefficient of thermal expansion.

(2) In the epoxy resin composition of the present invention, an active ester is used as the curing agent for not producing polar groups such as secondary hydroxyl groups when active esters react with epoxy resin, so that the cured product has a low water absorption.

(3) By using the mutual synergistic effect among the components, the epoxy composition of the present invention overcomes the defects of the composition systems of the epoxy resin containing oxazolidinone and the curing agents such as novolac curing agents, amine curing agents, e.g. worse moisture and heat resistance, high dielectric loss factor and the like. The prepreg, laminate, printed circuit board prepared from the epoxy resin composition have a low coefficient of thermal expansion, a low dielectric loss factor Df of less than or equal to 0.0084, a low water absorption of less than or equal to 0.46% and excellent moisture and heat resistance.

EMBODIMENTS

The technical solution of the present invention is further explained by the following embodiments.

Those skilled in the art should know that the examples are only for understanding the present invention, and shall not be deemed as specific limits to the present invention.

An epoxy resin composition metal-clad laminate prepared thereby was tested for the glass transition temperature, thermal decomposition temperature, coefficient of thermal expansion, dielectric constant, dielectric loss factor, PCT and PCT water absorption, which were stated and described in detail in the following examples, wherein the mass part of organic resins is based on the mass part of the organic solid matter.

Epoxy resins having different structures according to claim 1 were synthesized by the method of preparing the epoxy resin containing oxazolidinone structure by conventionally reacting epoxy resins with polyisocyanate disclosed in U.S. Pat. No. 5,112,932.

Synthesis Example 1

Synthesis of epoxy resins containing bisphenol-A structure and diphenylmethane structure, having the following structure

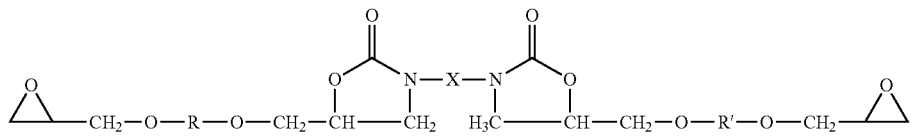

wherein

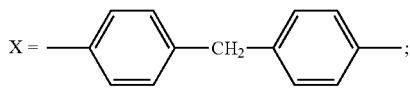

R and R' both are

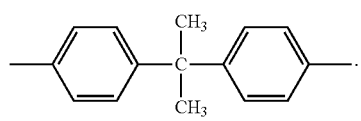

Into a three-necked flask (1000 mL) equipped with a stirrer, a thermometer and a reflux condenser was added 400 g of bisphenol-A epoxy resin, which was heated to 145-150° C. under the protection of nitrogen gas. 2-phenylimidazole (0.175 g) was added and then heated to 160° C. At 160° C., 100 g of diphenylmethanediisocyanate (MDI) was dropwise added to the aforesaid mixed solution within 30 min. After MDI was added, thermostatic reaction was carried out at 160° C. under the protection of nitrogen gas, and stopped after 15 min. The reacted solution was slowly added into stirred distilled water, to separate out the polymer, filtrated, water-washed, dried, impregnated with methanol for 24 h, vacuum-dried to obtain the product.

Synthesis Example 2

Synthesis of epoxy resins containing tetrabromo-bisphenol-A structure and diphenylmethane structure, having the following structure

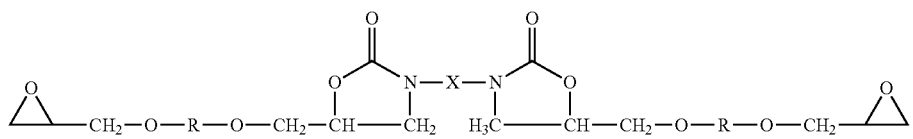

wherein

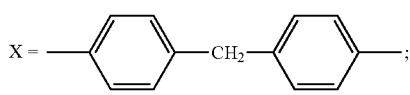

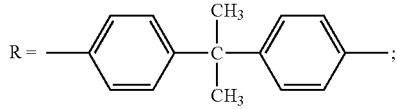

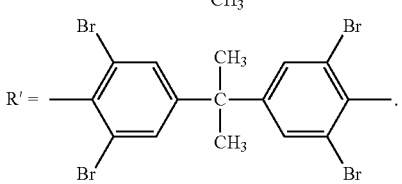

Into a three-necked flask (1000 mL) equipped with a stirrer, a thermometer and a reflux condenser was added 245 g of bisphenol-A epoxy resin and 185 g of tetrabromo-bisphenol-A epoxy resin, which was heated to 145-150° C. under the protection of nitrogen gas. 0.2 g of 2-phenylimidazole was added and then heated to 160° C. At 160° C., 90 g of diphenyl-methane-diisocyanate (MDI) was dropwise added to the aforesaid mixed solution within 30 min. After MDI was added, thermostatic reaction was carried out at 160° C. under the protection of nitrogen gas, and stopped after 15 min. The reacted solution was slowly added into stirred distilled water, to separate out the polymer, filtrated, water-washed, dried, impregnated with methanol for 24 h, vacuum-dried to obtain the product.

Synthesis Example 3

Synthesis of epoxy resins containing bisphenol-A structure and 2,4-toluene structure, having the following structure

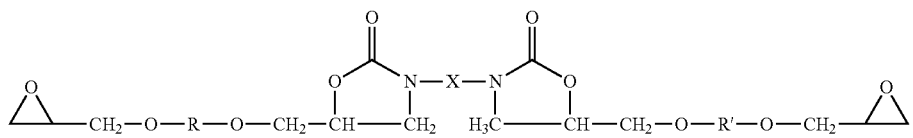

wherein

X = 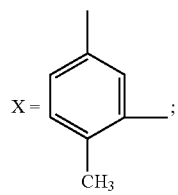 ;

R and R' both are

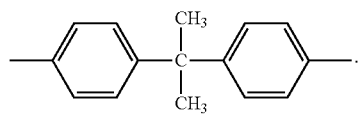

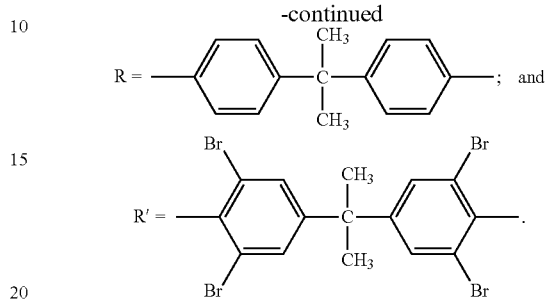

Into a three-necked flask (1000 mL) equipped with a stirrer, a thermometer and a reflux condenser was added 400 g of bisphenol-A epoxy resin, which was heated to 135-140° C. under the protection of nitrogen gas. 0.175 g of 2-phenylimidazole was added and then heated to 160° C. At 160° C., 100 g of toluene-2,4-diisocyanate (TDI) was dropwise added to the aforesaid mixed solution within 30 min. After TDI was added, thermostatic reaction was carried out at 160° C. under the protection of nitrogen gas, and stopped after 15 min. The reacted solution was slowly added into stirred distilled water, to separate out the polymer, filtrated, water-washed, dried, impregnated with methanol for 24 h, vacuum-dried to obtain the product.

Synthesis Example 4

Synthesis of epoxy resins containing tetrabromo-bisphenol-A structure and 2,4-toluene structure, having the following structure

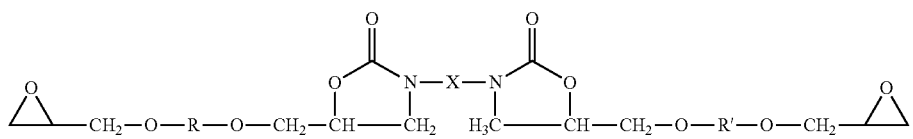

wherein

X = 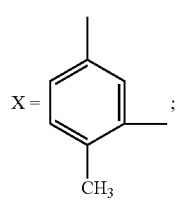 ;

Into a three-necked flask (1000 mL) equipped with a stirrer, a thermometer and a reflux condenser was added 245 g of bisphenol-A epoxy resin and 185 g of tetrabromo-bisphenol-A epoxy resin, which was heated to 135-140° C. under the protection of nitrogen gas. 0.2 g of 2-phenylimidazole was added and then heated to 160° C. At 160° C., 90 g of toluene-2,4-diisocyanate (TDI) was dropwise added to the aforesaid mixed solution within 30 min. After TDI was added, thermostatic reaction was carried out at 160° C. under the protection of nitrogen gas, and stopped after 15 min. The reacted solution was slowly added into stirred distilled water, to separate out the polymer, filtrated, water-washed, dried, impregnated with methanol for 24 h, vacuum-dried to obtain the product.

Example 1

Into a container was added 60 parts by weight of the product in Synthesis Example 1. A suitable amount of MEK was added and stirred till complete dissolution. Then an active ester and a curing accelerator DMAP dissolved in advance were added and homogeneously stirred. Finally a solvent was used to adjust the solid content of the liquid to 60-80% so as to obtain a glue solution. A glass fiber cloth was impregnated with the aforesaid glue solution, and to control the thickness thereof, and then dried to remove the solvent to obtain a prepreg. Several prepregs were overlapped with each other, coated with one sheet of RTF copper foil on each side thereof, placed into a thermocompressor and cured to obtain said epoxy resin copper-clad laminate. The formulation and physical properties thereof are shown in Table 1.

Example 2

Into a container was added 65 parts by weight of the product in Synthesis Example 1. A suitable amount of MEK was added and stirred till complete dissolution. Then an active ester and a curing accelerator DMAP dissolved in advance were added and homogeneously stirred. Cyanate and zinc isoocatanoate dissolved in advance were added. Finally a solvent was used to adjust the solid content of the liquid to 60-80% so as to obtain a glue solution. A glass fiber cloth was impregnated with the aforesaid glue solution, and to control the thickness thereof, and then dried to remove the solvent to obtain a prepreg. Several prepregs were overlapped with each other, coated with one sheet of RTF copper foil on each side thereof, placed into a thermocompressor and cured to obtain said epoxy resin copper-clad laminate. The formulation and physical properties thereof are shown in Table 1.

Example 3

The preparation process was the same as Example 2. The formulation and physical properties thereof are shown in Table 1.

Examples 4-8

The preparation processes were the same as Example 1. The formulations and physical properties thereof are shown in Table 1.

Example 9

Into a container was added 60 parts by weight of the product in Synthesis Example 1. A suitable amount of MEK was added and stirred till complete dissolution. Then an active ester and a curing accelerator DMAP dissolved in advance were added, and a suitable proportion of fillers were added and homogeneously stirred. Finally a solvent was used to adjust the solid content of the liquid to 60-80% so as to obtain a glue solution. A glass fiber cloth was impregnated with the aforesaid glue solution, and to control the thickness thereof, and then dried to remove the solvent to obtain a prepreg. Several prepregs were overlapped with each other, coated with one sheet of RTF copper foil on each side thereof, placed into a thermocompressor and cured to obtain said epoxy resin copper-clad laminate. The formulation and physical properties thereof are shown in Table 1.

Example 10

The preparation process was the same as Example 9. The formulation and physical properties thereof are shown in Table 1.

Example 11

Into a container was added 65 parts by weight of the product in Synthesis Example 1. A suitable amount of MEK was added and stirred till complete dissolution. Then an active ester and a curing accelerator DMAP dissolved in advance were added and homogeneously stirred. Cyanate and zinc isoocatanoate dissolved in advance were added, and a suitable proportion of fillers were added and homogeneously stirred. Finally a solvent was used to adjust the solid content of the liquid to 60-80% so as to obtain a glue solution. A glass fiber cloth was impregnated with the aforesaid glue solution, and to control the thickness thereof, and then dried to remove the solvent to obtain a prepreg. Several prepregs were overlapped with each other, coated with one sheet of RTF copper foil on each side thereof, placed into a thermocompressor and cured to obtain said epoxy resin copper-clad laminate. The formulation and physical properties thereof are shown in Table 1.

Examples 12-14

The preparation processes were the same as Example 11. The formulations and physical properties thereof are shown in Table 1.

Comparison Examples 1-4

The preparation processes were the same as Example 1. The formulations and physical properties thereof are shown in Table 2.

Comparison Examples 5-6

The preparation processes were the same as Example 2. The formulations and physical properties thereof are shown in Table 2.

The formulations and performance test results in Examples 1-8 are shown in Table 1; the formulations and performance test results in Examples 9-14 are shown in Table 2; the formulations and performance test results in Example 1 and Comparison Examples are shown in Table 3.
Table 2

TABLE 1

The formulations and performance test results in Examples 1-8

| Formulation | Substances | Examples | | | | | | | |
| --- | --- | --- | --- | --- | --- | --- | --- | --- | --- |
| | | 1 | 2 | 3 | 4 | 5 | 6 | 7 | 8 |
| Epoxy resin | Synthesis Example 1 | 60 | 65 | 65 | 60 | 60 | | | |
| | Synthesis Example 2 | | | | | | 60 | | |
| | Synthesis Example 3 | | | | | | | 60 | |
| | Synthesis Example 4 | | | | | | | | 60 |
| Active ester | Active ester | 1eq | 35 | 35 | 0.9eq | 1.1eq | 1eq | 1eq | 1eq |
| Cyanate | Cyanate | / | 10 | 40 | / | / | / | / | / |
| Accelerator | DMAP | q.s. | q.s. | q.s. | q.s. | q.s. | q.s. | q.s. | q.s. |
| | Zinc isoocatanoate | / | q.s. | q.s. | / | / | / | / | / |
| Performance | CTE | 3.4% | 3.2% | 3.1% | 3.4% | 3.3% | 3.3% | 3.4% | 3.4% |

TABLE 1-continued

The formulations and performance test results in Examples 1-8

| Formulation | Substances | 1 | 2 | 3 | 4 | 5 | 6 | 7 | 8 |
|---|---|---|---|---|---|---|---|---|---|
| | Df | 0.0082 | 0.0080 | 0.0075 | 0.0083 | 0.0081 | 0.0084 | 0.0083 | 0.0084 |
| | PCT water absorption | 0.17% | 0.24% | 0.26% | 0.18% | 0.17% | 0.20% | 0.18% | 0.20% |
| | PCT | 0/3 | 0/3 | 0/3 | 0/3 | 0/3 | 0/3 | 0/3 | 0/3 |

TABLE 2

The formulations and performance test results in Examples 9-14

| Formulation | Substances | 9 | 10 | 11 | 12 | 13 | 14 |
|---|---|---|---|---|---|---|---|
| Epoxy resin | Synthesis Example 1 | 60 | 60 | 65 | 65 | 65 | 65 |
| Active ester | Active ester | 1eq | 1eq | 35 | 35 | 35 | 35 |
| Cyanate | Cyanate | / | / | 10 | 10 | 40 | 40 |
| Accelerator | DMAP | q.s. | q.s. | q.s. | q.s. | q.s. | q.s. |
| | Zinc isoocatanoate | | | q.s. | q.s. | q.s. | q.s. |
| Filler | Spherical silica powder | 30 | | 30 | | 30 | |
| | Molten silica powder | | 30 | | 30 | | 30 |
| Performance | CTE | 3.0% | 3.3% | 3.3% | 3.2% | 2.8% | 2.8% |
| | Df | 0.0074 | 0.0079 | 0.0073 | 0.0078 | 0.0071 | 0.0073 |
| | PCT water absorption | 0.36% | 0.44% | 0.39% | 0.46% | 0.41% | 0.46% |
| | PCT | 0/3 | 0/3 | 0/3 | 0/3 | 0/3 | 0/3 |

TABLE 3

The formulations and performance test results in Example 1 and Comparison Examples

| Formulation | Substances | Example 1 | Comparison Examples 1 | 2 | 3 | 4 | 5 | 6 |
|---|---|---|---|---|---|---|---|---|
| Epoxy resin | Synthesis Example 1 | 60 | | | | 60 | | |
| | Epoxy resin 1 | | 60 | 60 | | | 65 | 65 |
| | Epoxy resin 2 | | | | 60 | | | |
| Active ester | Active ester | 1eq | 1eq | | | 1eq | 35 | 35 |
| Phenolic curing agent | Phenolic resin 1 | / | / | 1eq | 1eq | / | / | / |
| Cyanate resin | Cyanate | / | / | / | / | / | 10 | 40 |
| Curing accelerator | DMAP | q.s. | q.s. | q.s. | q.s. | q.s. | q.s. | q.s. |
| | Zinc isoocatanoate | | | | | | q.s. | q.s. |
| Performance | CTE | 3.4% | 3.6% | 3.4% | 3.7% | 3.5% | 3.4% | 3.2% |
| | Df | 0.0082 | 0.0092 | 0.0142 | 0.0174 | 0.0099 | 0.0085 | 0.0088 |
| | PCT water absorption | 0.17% | 0.19% | 0.44% | 0.67% | 0.22% | 0.26% | 0.30% |
| | PCT | 0/3 | 0/3 | 0/3 | 3/3 | 0/3 | 0/3 | 0/3 |

In Tables 1, 2 and 3, when the main resin components in the formulations are bi-component, the curing agent ratio is represented by the equivalent ratio of the epoxy resins. When the main resin components in the formulations are multi-component (beyond bi-component), the curing agent ratio is represented by the solid weight ratio of the epoxy components.

The materials in Tables 1 and 2 are listed as follows.

Epoxy resin 1: biphenyl novolac epoxy resin NC-3000H (Trade name from Nippon Kayaku).

Epoxy resin 2: dicyclopentadiene novolac epoxy resin HP-7200HHH (Trade name from DIC Japan)

Phenolic resin 1: novolac curing agent KPH-2002 (Trade name from KOLON)

Active ester: active ester crosslinking agent HPC-8000-65T (Trade name from DIC Japan)

Cyanate: biphenol A-cyanate resin CE01PS (Trade name from Yangzhou Apocalypse)

DMAP: Curing accelerator, 4-dimethylaminopyridine (Trade name from Guangrong Chemical Company)

Zinc isoocatanoate: curing accelerator (Trade name from Alfa Aesar)

The aforesaid properties are tested by the following methods:

(1) Coefficient of thermal expansion (CTE): tested by the TMA method as stipulated under IPC-TM-6502.4.24.6 of Thermal Mechanical Analyzer (TMA).

(2) Dielectric constant and dielectric loss factor: tested by the method as stipulated under IPC-TM-6502.5.5.13, under the frequency of 10 GHz.

(3) PCT post-dip soldering resistance evaluation: etching the copper foil on the surface of copper-clad plate and evaluating the plate; placing the plate in a pressure cooker and treating at 120° C. and 105 Kpa for 2 h; impregnating at 288° C. in a solder machine, and recording the corresponding time when the delamination of the plate happens; finishing the evaluation when there is no bubbles or delamination after the plate is placed in the solder machine for more than 5 min. If there is 0, 1, 2 and 3 having bubbles or delamination in three plates, 0/3, 1/3, 2/3 and 3/3 are marked.

(4) PCT water absorption: etching the copper foil on the surface of copper-clad plate, weighing and recording as $m_1$, placing the plate into a pressure cooker, treating at 120° C. and 105 Kpa for 2 h, drying the sample with dry cloth and weighing immediately and recording as $m_2$. PCT water absorption %=$(m_2-m_1)/m_1 \times 100\%$.

Physical Property Analyses (1) By comparing Examples 2, 3 with 1, it can be seen that the coefficient of thermal expansion and dielectric loss factor in Examples 2 and 3 are lower than those in Example 1, but the water absorption is higher than that in Example 1, which shows that the introduction of cyanate can reduce the coefficient of thermal expansion and dielectric loss factor of the composition, but increase the water absorption of the composition.

(2) By comparing Example 2 with 3, it can be seen that the coefficient of thermal expansion and dielectric loss factor in Example 3 are lower than those in Example 2, but the water absorption is higher than that in Example 1, which shows that the composition has lower dielectric loss factor and higher water absorption along with the increase of cyanate content.

(3) By comparing Examples 6, 7, 8 with 1, it can be seen that they all have similar dielectric loss factor and water absorption. However, the Br-containing components have relatively greater water absorption and dielectric loss factor. In addition, the epoxy resin containing diphenylmethane structure has better symmetry as compared to that containing methyl structure, so as to have lower dielectric loss factor.

(4) Examples 9-14 show that the composition into which the filler is added has a decreased coefficient of thermal expansion and dielectric loss factor, but an increased water absorption, and an excellent moisture and heat resistance. As compared to the molten silica powder, spherical silica powder can bring lower dielectric loss factor and water absorption.

(5) According to Comparison Examples 2 and 3, it can be seen that there is PCT delamination phenomenon for the composition containing oxazolidinone epoxy resin and novolac resin in Comparison Example 3, which shows a worse moisture and heat resistance. There is no delamination phenomenon for the composition containing biphenyl epoxy and novolac resin in Comparison Example 2, and it has a lower dielectric loss factor and water absorption as compared with the composition system in Comparison Example 3. There is no delamination phenomenon for the compositions containing oxazolidinone epoxy resin and active ester resin in Examples 1 and 6-8 as compared to the composition containing biphenyl epoxy and active ester in Comparison Example 1 and the composition containing dicyclopentadiene epoxy and active ester in Comparison Example 4. As compared to other two compositions in Comparison Examples 1 and 4, the composition containing oxazolidinone epoxy resin and active ester resin has a lower dielectric loss factor and a lower water absorption. It can be seen that the epoxy resin containing oxazolidinone structure and active ester can exert the synergistic effect and ensure the composition to have a lower dielectric loss factor, a lower expansion coefficient and water absorption and to have the moisture and heat resistance as compared to the compositions using a single component.

(6) By comparing Examples 2 and 3 with Comparison Examples 5 and 6, it can be seen that coefficient of thermal expansion, dielectric loss factor and water absorption are lower than those in Comparison Examples 4 and 5, which shows that the introduction of cyanate still can exert the synergistic effect, and make the composition have lower coefficient of thermal expansion, dielectric loss factor and water absorption.

(7) According to Examples 1-14, it can be seen that, in the PCT-post-dip soldering resistance evaluation by using the composition of the present invention, none of the experimental samples has delamination or blistering phenomena, which shows that it has excellent moisture and heat resistance.

As stated above, the present invention has low coefficient of thermal expansion, low dielectric loss factor, low water absorption and excellent moisture and heat resistance as compared to general laminates.

The aforesaid examples are merely preferred examples. According to the technical solution and technical concept of the present invention, those ordinarily skilled in the art can make various changes and deformation, which all belong to the scope of the claims of the present invention.

The applicant declares that, the present invention detailedly discloses the process of the present invention by the aforesaid examples, but the present invention is not limited by the detailed process, i.e. it does not mean that the present invention cannot be fulfilled unless the aforesaid detailed process is used. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. An epoxy resin composition, characterized in comprising the following components:
   (A) an epoxy resin containing oxazolidinone structure having the structure of the formula (1)

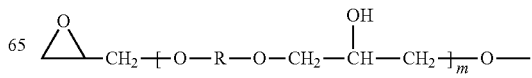

Formula (1)

-continued

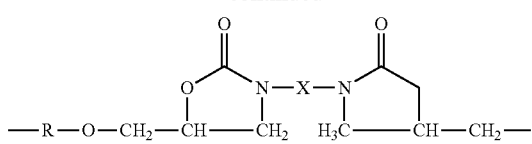

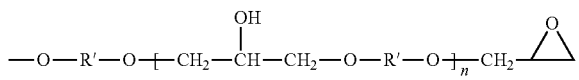

wherein
m and n are each independently selected from the group consisting of 0, 1 and 2;

X is 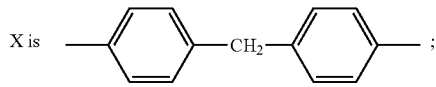 ;

R and R' each is independently selected from

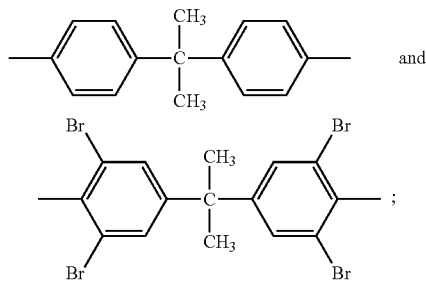

(B) an active ester curing agent;
(C) a curing accelerator; and
(D) a cyanate ester resin;
wherein the component (B) active ester curing agent is an active ester comprising the structure of formula (3):

Formula (3)

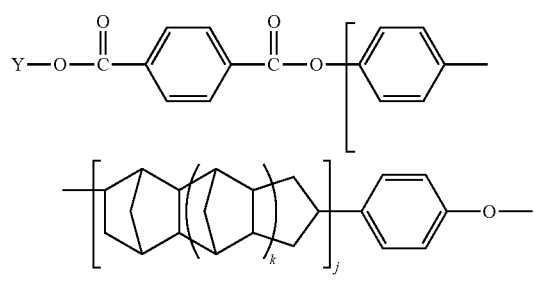

-continued

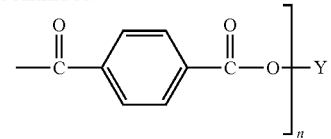

wherein Y is phenyl or naphthyl; j is 0 or 1; k is 0 or 1; n represents that the repeating unit is 0.25-1.25.

2. The epoxy resin composition according to claim 1, characterized in that in the structure of formula (1), m=0, and n=0; the component (A) comprises an epoxy resin containing oxazolidinone structure having the structure of the formula (2)

Formula (2)

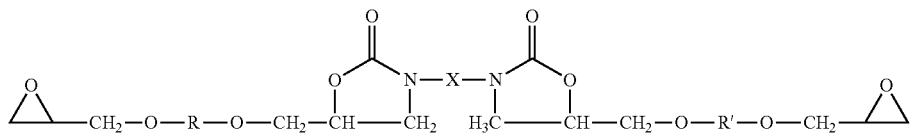

wherein R and R' have the same scope as claim 1.

3. The epoxy resin composition according to claim 1, characterized in that R and R' are the same.

4. The epoxy resin composition according to claim 1, characterized in that the epoxy resin composition further comprises a filler which is an organic filler or/and an inorganic filler.

5. The epoxy resin composition according to claim 4, characterized in that based on the sum of the addition amounts of the components (A) epoxy resin containing oxazolidinone structure, (B) active ester curing agent, and (C) curing accelerator being 100 parts by weight, the filler is added in an amount of 100 parts by weight or less.

6. The epoxy resin composition according to claim 4, characterized in that the inorganic filler is anyone selected from the group consisting of molten silica, crystal silica, spherical silica, hollow silica, aluminum hydroxide, alumina, talc, aluminum nitride, boron nitride, silicon carbide, barium sulfate, barium titanate, strontium titanate, calcium carbonate, calcium silicate, mica or glass fiber cloth, or a mixture of at least two selected therefrom.

7. The epoxy resin composition according to claim 4, characterized in that the organic filler is anyone selected from the group consisting of polytetrafluoroethylene powder, polyphenylene sulfide or polyether sulfone, or a mixture of at least two selected therefrom.

8. The epoxy resin composition according to claim 4, characterized in that the filler is silica; the medium value of the particle size of the filler is from 1 to 15 μm.

9. A prepreg comprising a reinforcing material and the epoxy resin composition according to claim 1 attached thereon after impregnation and drying.

10. A laminate comprising at least one sheet of the prepreg according to claim 9.

11. The epoxy resin composition according to claim 1, characterized in that the component (A) epoxy resin containing oxazolidinone structure and the component (B) active ester curing agent have an epoxide equivalent/ester group equivalent ratio of 1:0.9-1.1.

12. The epoxy resin composition according to claim 1, characterized in that the component (C) curing accelerator is anyone selected from the group consisting of 4-dimethylaminopyridine, 2-methylimidazole, 2-ethyl-4-methyl-imidazole or 2-phenylimidazole, or a mixture of at least two selected therefrom.

13. The epoxy resin composition according to claim 1, characterized in that based on the sum of the addition amounts of the components (A) epoxy resin containing oxazolidinone structure and (B) active ester curing agent being 100 parts by weight, the component (C) curing accelerator is added in an amount of from 0.05 to 1 part by weight.

14. The epoxy resin composition according to claim 13, characterized in that based on the sum of the addition amounts of the components (A) epoxy resin containing oxazolidinone structure, (B) active ester curing agent and (C) curing accelerator being 100 parts by weight, the cyanate ester resin is added in an amount of 50 parts by weight or less.

15. The epoxy resin composition according to claim 1, characterized in that the epoxy resin composition further comprises a flame retardant; the flame retardant is a bromine-containing flame retardant or/and halogen-free flame retardant.

16. The epoxy resin composition according to claim 15, characterized in that the flame retardant is added in an amount of from 5 to 50 parts by weight, based on the sum of the addition amounts of the components (A), (B) and (C).

17. The epoxy resin composition according to claim 15, characterized in that the bromine-containing flame retardant is anyone selected from the group consisting of decabromodiphenyl ethane, brominated polystyrene, ethylene bis-tetrabromo phthalimide or bromine-containing epoxy resin, or a mixture of at least two selected therefrom.

18. The epoxy resin composition according to claim 15, characterized in that the halogen-free flame retardant is anyone selected from the group consisting of tri(2,6-dimethylphenyl)phosphine, 10-(2,5-dihydroxylphenyl)-9,10-dihydro-9-oxa-10-phosphaphenanthrene-10-oxide, 2,6-di(2,6-dimethylphenyl)-phosphinophenyl; 10-phenyl-9,10-dihydro-9-oxa-10-phosphaphenanthrene-10-oxide, phenoxyphosphazene compound, zinc borate, nitrogen and phosphorus-based intumescent, organic polymer flame retardant, and copolymers of phosphorus-containing phenolic resin or phosphorus-containing bismaleimide, polyphosphonate, phosphonate and carbonate, or a mixture of at least two selected therefrom.

* * * * *